United States Patent [19]

Chan

[11] Patent Number: 4,638,243
[45] Date of Patent: Jan. 20, 1987

[54] SHORT DETECTOR FOR FUSIBLE LINK ARRAY USING SINGLE REFERENCE FUSE

[75] Inventor: Andrew K. Chan, Milpitas, Calif.

[73] Assignee: Monolithic Memories, Inc., Santa Clara, Calif.

[21] Appl. No.: 741,658

[22] Filed: Jun. 5, 1985

[51] Int. Cl.$^4$ ............................................. G01R 31/02
[52] U.S. Cl. .................................. 324/51; 324/73 PC; 371/21; 371/25
[58] Field of Search ............ 324/51, 52, 73 R, 73 AT, 324/73 PC, 158 T; 371/21, 25, 15; 365/201, 96

[56] References Cited

U.S. PATENT DOCUMENTS 4,499,579  2/1985  Still et al. ............................. 371/15

OTHER PUBLICATIONS

Logue et al, Programmable Logic Array Error Detection and Error Correction, IBM Technical Disclosure Bulletin, vol. 19, No. 2, Jul. 1976, pp. 588–590.

Primary Examiner—Reinhard J. Eisenzopf
Assistant Examiner—Jack B. Harvey
Attorney, Agent, or Firm—Steven F. Caserza; Alan H. MacPherson; Walter J. Madden

[57] ABSTRACT

Circuitry is provided for testing fusible link arrays for short circuits around the fusible links. Each link is electrically isolated and compared with a reference fusible link to detect the presence or absence of a short circuit.

5 Claims, 2 Drawing Figures

SHORT DETECTOR FOR FUSIBLE LINK ARRAY USING SINGLE REFERENCE FUSE

CROSS REFERENCE TO RELATED APPLICATIONS

Copending application Ser. No. 635,861, filed July 30, 1984, and assigned to the same assignee as the present application, discloses circuitry for testing a fusible link array using a pair of reference fusible links to test each fuse in the array.

Copending application Ser. No. 663,806, filed Oct. 22, 1984, and assigned to the same assignee as the present application, discloses a fusible link array tester in which the resistance of each of the four quadrants in the tested link array is compared with the resistance of an array of reference fusible links.

BACKGROUND OF THE INVENTION

1. Field of the Invention

This invention relates to the testing for short circuits in fusible link arrays which are used in Programmable Read Only Memories (PROM) and Programmable Array Logic, and the like.

2. Description of the Prior Art

In a typical array employing fusible links, a bit of information is represented by a fusible link, also called a "fuse". The presence or absence of a fuse determines the logical state of a bit. The device is manufactured with all fuses intact; that is, all bits are originally in one logical state. The user of the device can then choose the state of a bit by either leaving the fuse intact, or blowing the fuse (programming the bit) to create an open circuit (i.e. an absent fuse). Ideally, all devices as manufactured will have all their fuses intact before being packaged and sold, and when sold, every fuse the user wants to blow will indeed blow. In reality, this is not the case, and some devices will have fuses missing and others will have fuses that won't blow.

A missing fuse in an array is easy to detect, and is caught before the device is packaged, such as by checking the logical state on the output pin of the device. The logical state for a missing fuse will be opposite to that for an intact fuse. The device can be tested for any missing fuses at the wafer sorting level of the manufacturing process.

A typical fusible link array includes a rectangular array of transistors and associated fuses connected between word lines and bit lines. Prior to programming, each memory cell which includes the transistor and its associated fuse stores a logical 0, i.e. the fuse is not open. A leaky base emitter junction of an NPN transistor or a short between a bit line and a word line may result in a fuse which fails to open when a programming current is attempted to be applied to the fuse. A typical titanium-tungsten (TiW) fuse used in many arrays requires approximately 3 volts across the fuse in order to produce the approximately 50 milliampere (mA) current required to open the fuse. During normal operation (i.e., reading) of the array, the maximum supply voltage is approximately 5.5 volts, and there is not enough voltage across the fuse to cause 50 mA of current required to open the fuse.

Accordingly, one of the steps of the programming procedure is to raise the supply voltage to approximately 12 volts, well above the levels used during reading the array. A memory cell to be programmed containing the array transistor is selected by selecting the proper word line and bit line. The selected word line and thus the base of the selected transistor is at approximately 8 volts, a voltage level determined by internal clamping circuitry. The remaining deselected word lines are at approximately 1 volt. The base emitter voltage of the selected array transistor at a base emitter current of 50 mA is approximately 1.5 volts. So the emitter of the array transistor which is connected to one end of its associated fuse is at a voltage of approximately 8 volts−1.5 volts=6.5 volts. The programming circuit holds the voltage on the selected bit line on the other end of the fuse at approximately 1.5 volts if the fuse is to open to store a logical one. Therefore, the voltage across the fuse is approximately 6.5 volts−1.5 volts=5.0 volts which will cause a current flow greater than 50 mA and thus cause the fuse to open, thereby storing a logical 1.

Conversely, if the fuse is not to be opened and the cell is to store a logical zero, the bit line is held at approximately 7 volts, so that the voltage drop across the fuse is insufficient to cause a current which will cause the fuse to open.

When a fuse is intact but refuses to blow, it is for one of several reasons. The fuse itself may be fatter or thicker than a normal fuse and therefore requires more power to blow; more power indeed than the programmer can provide. It, therefore, remains intact when an attempt to program it is made. Also, metal can short out the fuse. For example, a small piece of metal can short from the emitter of the array transistor to the bit line. Metal can also short from the word line to the bit line. In both cases, the metal will not blow as a fuse will. The metal requires a great deal more power to melt and break down than the fuse material, and it prevents the fuse from blowing by providing an alternate path for the programming current. The fuse, therefor remains intact. These are examples of what is defined collectively as a "fuse short".

In summary, a missing fuse can be found during manufacture by detecting the wrong logical state at the output pin of the device. However, a fuse short will show the correct logical state on the output until an attempt is made to program it, at which time the output pin will still show the logical state of an intact fuse indicating that the fuse has failed to blow. The problem is that the device has been packaged and sold to the user before the fuse short is discovered, costing the manufacturer money, time and reputation. The present invention will prevent this from occurring.

SUMMARY OF THE PRESENT INVENTION

The present invention provides for testing of an array containing fusible links, prior to its packaging, to detect fuse shorts therein. Each fusible link in the array can be individually tested against a reference fusible link and the location of any fuse short can be determined.

DESCRIPTION OF THE PREFERRED EMBODIMENT

Figure 1:
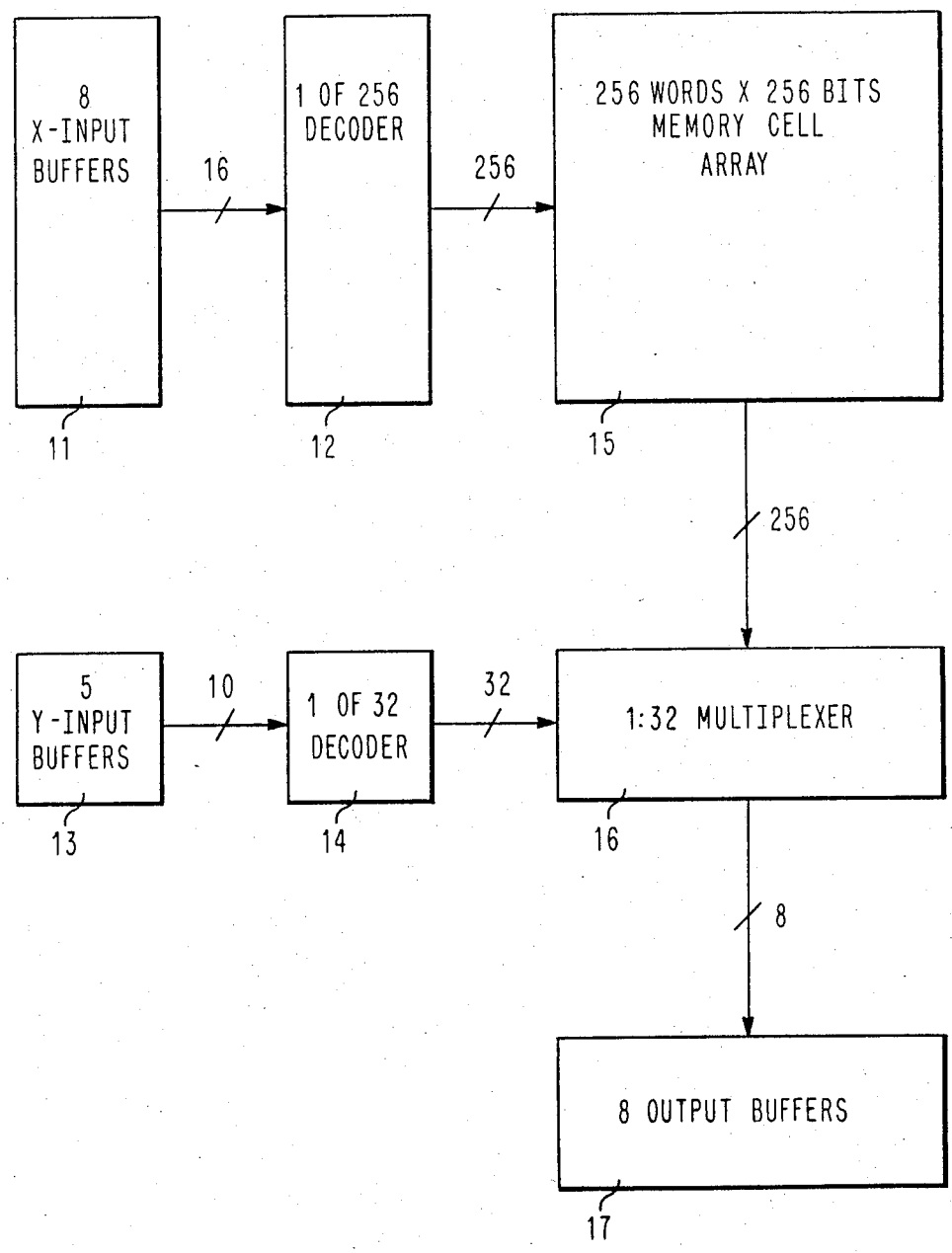
FIG. 1 is a block diagram of a typical bipolar PROM.

The organization of a 64K PROM shown in FIG. 1 is typical of most bipolar PROMs. There are 8 x-input buffers 11 which feed into a 1-of-256 decoder 12, which selects one word line in the memory cell array 15. The 5 y-input buffers 13 feed into 1-of-32 decoder 14 which in turn feeds into a 256 line-to-8 line multiplexer 16. This chooses 8 bit lines in the array which are fed to output buffer 17, one line to one output.

Figure 2:
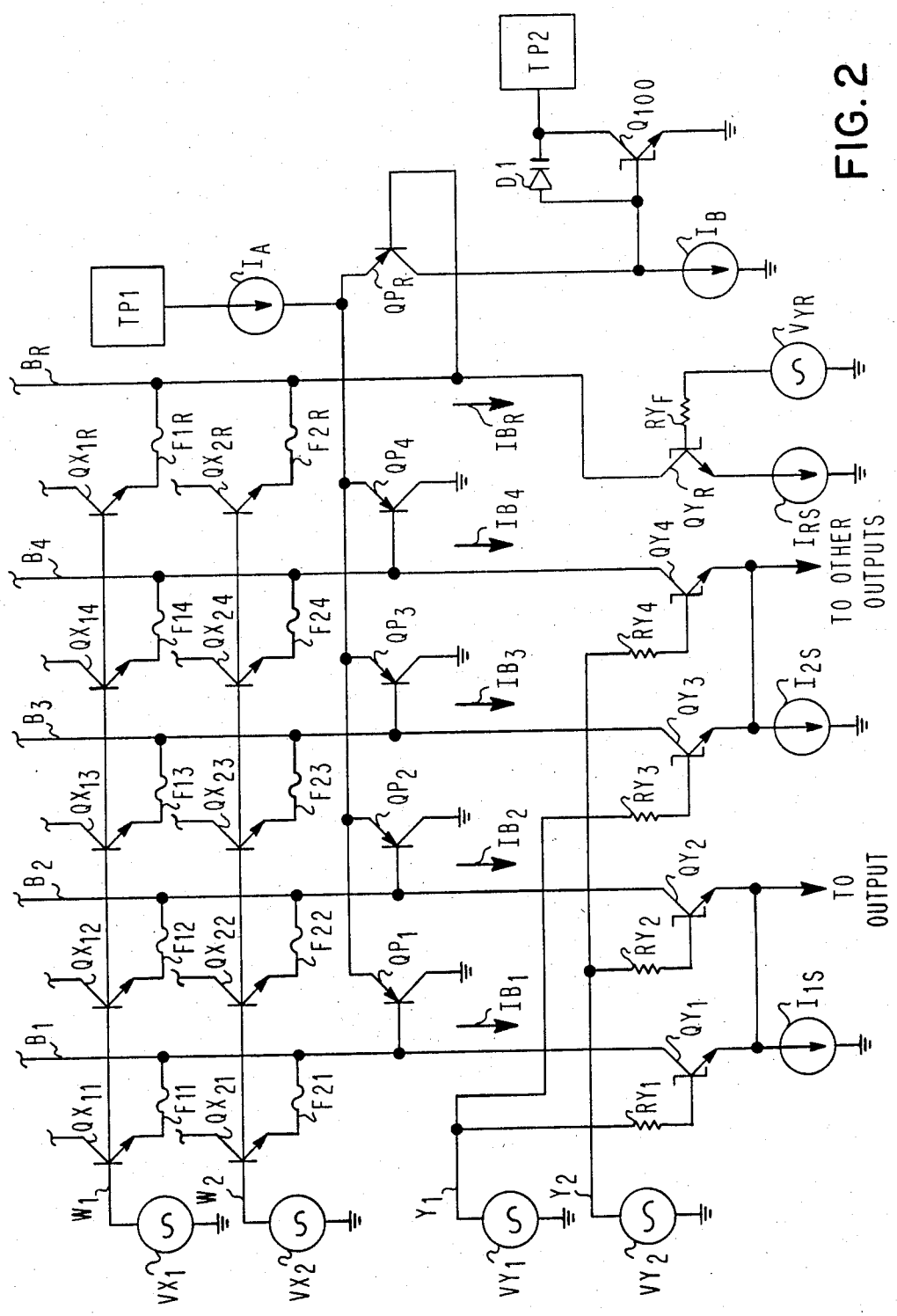
FIG. 2 is a circuit showing the array and multiplexer of FIG. 1.

A very simplified view of the array and multiplexing block of FIG. 1 is given in FIG. 2. Each output accesses 32 bit lines. In FIG. 2, B1 is the accessed bit line, and B2 represents the 31 unselected bit lines. QY1 is the multiplexer transistor which is on to select B1. QY2 represents the 31 multiplexer transistors which are off and thus not selecting the bit lines represented by B2. The emitters of QY1 and QY2 are common and are connected to I1S, the sense amplifier current for one output. The sense amplifier detects the presence or absence of a fuse during normal operation and feeds this information to the output buffer. The bit line B3 represents the seven other bit lines that are selected and fed through seven QYs (here QY3) to the seven other sense amplifier outputs. B4 represents the 31 other bit lines for each output which is not selected.

W1 is the selected word line and W2 represents the 255 word lines not selected. QX11 is on and F11 represents the first fusible link to be tested. QX12 represents the other 31 array transistors available to that output and are off because QY2 is off. QX13 represents the array transistors going to the other seven outputs. They are on and current flows through fuse F13 from QX13 to I2S, which represents the sense amplifier currents for the other seven outputs. QX14 represents all the other array transistors not selected on W1. W2 represents the 255 word lines not selected, and they therefore are off.

In the present invention, only one fuse is tested at a time. All but one of the eight sense amplifiers are turned off, i.e. I2S=$\phi$. Therefore IB3=IB4=$\phi$. If fuse F11 is selected, i.e. W1 and Y1 are high, W2 and Y2 are low, then IB2=$\phi$, IB1≅I1S. The current IB1 flows from VCC into the collector of QX11 and out from its emitter through fuse F11 into the bit line B1. The voltage of bit line B1 is:

$$VB1 = VX1 - VBEQX11 - (IB1)(RF11) \tag{1}$$

Similarly:

$$VB2 = VX1 - VBEQX12 - (IB2)(RF12) \tag{2}$$

$$VB3 = VX1 - VBEQX13 - (IB3)(RF13) \tag{3}$$

$$VB4 = VX1 - VBEQX14 - (IB4)(RF14) \tag{4}$$

Since $IB2=IB3=IB4=\phi$ $$VB2 = VX1 - VBEQX12 \tag{5}$$

$$VB3 = VX1 - VBEQX13 \tag{6}$$

$$VB4 = VX1 - VBEQX14 \tag{7}$$

When the test is performed, TPI is raised to the same voltage as VCC and a resistor or current source is applied to TP2 as pull up (IOL≅100 µA). At this condition, current sources IA, IB, IRS and voltage source VYR are turned on and they are set as follows:

$$IA = 2(IB) \approx 4\phi\phi \ \mu A$$

$$VYR = VY1$$

$$IBR = IRS = I1S/2$$

On the reference bit BR, QX1R and QX2R have half the emitter size of the other array transistors. Fuses F1R and F2R are identical to other array fuses. The voltage developed on bit line BR is:

$$VBR = VX1 - VBEQX1R - (IBR)(RF1R) \tag{8}$$

$$VBR = VX1 - VBEQX1R - (I1S/2)(RF1R) \tag{9}$$

The voltages VB1, VB2, VB3, VB4 and VBR are applied to the bases of PNP transistors QP1, QP2, QP3, QP4 and QPR respectively. These transistors together with current sources IA, IB, diode D1 and transistor Q100 form the fuse short detector. The detector can be described as a level sensitive 4 input NAND gate with TP2 as output and bit lines B1, B2, B3 and B4 as inputs. Output TP2 is low (Q100 turns on) if, and only if, VB1, VB2, VB3 and VB4 are higher than voltage reference VBR.

Examination of the voltages reveal that VB2, VB3 and VB4 are obviously higher than VBR since they do not have the term representing the voltage drop across the fuse. Besides, the base emitter voltages VBEQX12, VBEQX13 and VBEQX14 are smaller than VBEQX1R because they represent base emitter voltages at zero current which is theoretically zero volts. Therefore, QP2, QP3 and QP4 are off and the differential voltage between VB1 and VBR determines the state of the output at TP2, i.e. if $\Delta VBE = VB1 - VBR$ is positive, then TP2 is low. Subtracting (9) from (1) gives:

$$\Delta VBE = VB1 - VBR$$

$$= (VX1 - VBEQX11 - (I1S)(RF11)) - (VX1 - VBEQX1R - (I1S/2)(RF1R))$$

$$\Delta VBE = (VBEQX1R - VBEQX11 + I1S(RF1R/2 - RF11)) \tag{10}$$

Using the diode equation $VBE = KT/q \ \ln \ (IC/(A)(JES) - 1)$ $$VBEQX1R = KT/q \ \ln \ ((I1S/2)/(A/2)(JES) - 1)$$

$$VBEQX1R = KT/q \ \ln \ (I1S/(A)(JES) - 1) \tag{11}$$

$$VBEQX11 = KT/q \ \ln \ (I1S/(A)(JES) - 1) \tag{12}$$

(11)–(12)

$$VBEQX1R - VBEQX11 = \phi$$

$$\Delta VBE = I1S(RF1R/2 - RF11) \tag{13}$$

where
KT/q = BOLTZMAN'S CONSTANT
IC = COLLECTOR CURRENT
A = EMITTER AREA
JES = REVERSE LEAKAGE CURRENT DENSITY If fuse F11 is normal and all fuses are matched and equal to RF, then $$\Delta VBE = -(I1S)(RF/2)$$

and TP2 is high. If fuse F11 is shorted or has very low resistance compared to RF/2, then $$\Delta V_{BE} \approx (I1S)(RF/2)$$

and TP2 is low.

For accurate detection, QP1 and QPR must have well matched base emitter voltages. However, as shown in the schematic, QPR is a lateral PNP while QP1 is a vertical PNP. For good matching with the lateral PNP, QPR, QP1 and the other vertical PNPs (QP2, QP3 and QP4) are actually identical lateral PNPs with their collectors tied to ground to form the vertical PNPs. Diode D1 is used as a capacitor to eliminate any undesirable oscillations which might be caused by the high gain differential amplifier stage.

I claim:

1. Circuitry for testing for short circuits in a fusible link array, said array having a plurality of discrete fusible links each having a nominal resistance RF, any short circuits in one of said fusible links presenting a resistance RFS which is substantially lower than RF, said circuitry comprising:
   means for electrically isolating one of said fusible links from the other of said links;
   a reference fusible link having a nominal resistance RF;
   a reference voltage circuit, said reference fusible link being connected in said reference voltage circuit;
   means for applying a voltage across the one of said fusible links under test and across said reference fusible link; and
   means for comparing the voltage across said fusible link under test with the voltage across said reference fusible link to provide an indication of the presence or absence of a short circuit across said fusible link under test.

2. Circuitry for testing for short circuits in a fusible link array, said array having a plurality of discrete fusible links each having a nominal resistance RF, any short circuit in one of said fusible links presenting a resistance RFS which is substantially lower than RF, said circuitry comprising:
   means for electrically isolating one of said fusible links from the other of said links;
   a reference fusible link having a nominal resistance RF;
   a reference voltage circuit, said reference fusible link being connected in said reference voltage circuit;
   means for applying a voltage across the one of said fusible links under test and across said reference fusible link; and
   means for detecting whether the voltage across said fusible link under test is larger or smaller than the voltage across said reference fusible link.

3. Circuitry in accordance with claim 2 in which said fusible links are arranged in an array having individually selectable orthogonal bit lines and word lines, the location of each of said fusible links being defined by the intersection of a bit line and a word line; and
   said means for electrically isolating one of said fusible links comprises means for selecting a given one of said bit lines and a given one of said word lines.

4. Circuitry in accordance with claim 3 including a reference fusible link for each of said word lines.

5. Circuitry in accordance with claim 3 including a voltage source;
   a first transistor connected to said voltage source through a selected one of said fusible links;
   a second transistor connected to said voltage source through said reference fusible link; and
   means for comparing the voltages across said first and second transistors to provide an indication of a short circuit across said fusible link under test.

* * * * *